United States Patent [19]

Woermbke et al.

[11] Patent Number: 5,170,137
[45] Date of Patent: Dec. 8, 1992

[54] FREQUENCY SELECTIVE LIMITER WITH WELDED CONDUCTORS

[75] Inventors: James D. Woermbke, Glen Burnie; William E. McGann, Linthicum; Thomas E. Steigerwald, Columbia, all of Md.

[73] Assignee: Westinghouse Electric Corp., Pittsburgh, Pa.

[21] Appl. No.: 656,340

[22] Filed: Feb. 19, 1991

[51] Int. Cl.⁵ .......................... H01P 1/218; H01P 1/23
[52] U.S. Cl. .................................... 333/17.2; 333/24.2
[58] Field of Search ...................... 333/17.2, 24.1–24.3, 333/1.1

[56] References Cited

U.S. PATENT DOCUMENTS

| | | | |
|---|---|---|---|
| 4,845,439 | 7/1989 | Stitzer et al. | 333/17.2 |
| 4,970,775 | 11/1990 | Brown et al. | 333/17.2 |
| 4,980,657 | 12/1990 | Stitzer et al. | 333/17.2 |
| 5,023,573 | 6/1991 | Adam | 333/17.2 |

*Primary Examiner*—Eugene R. LaRoche
*Assistant Examiner*—Michael B. Shingleton
*Attorney, Agent, or Firm*—John K. Williamson

[57] ABSTRACT

A frequency selective limiter is described in which first and second ferrite members have confronting planar surfaces and at least one conductor is located on the surface of each ferrite in intimate contact. Each conductor on the first ferrite is a mirror image and is paired to a corresponding conductor on the second ferrite. The paired conductors have confronting end surface portions which are intimately bonded or welded in electrical contact such that each of the paired conductors is electrically equivalent to a single conductor in closely coupled to the ferrites. No other form of bonding is necessary to secure the ferrite members together. In the invention, an external conformal ground plane is more securely deposited in the regions where the ferrites abut. In a particular embodiment, coplanar ground planes located between the ferrites are securely bonded to the conformal ground plane.

15 Claims, 4 Drawing Sheets

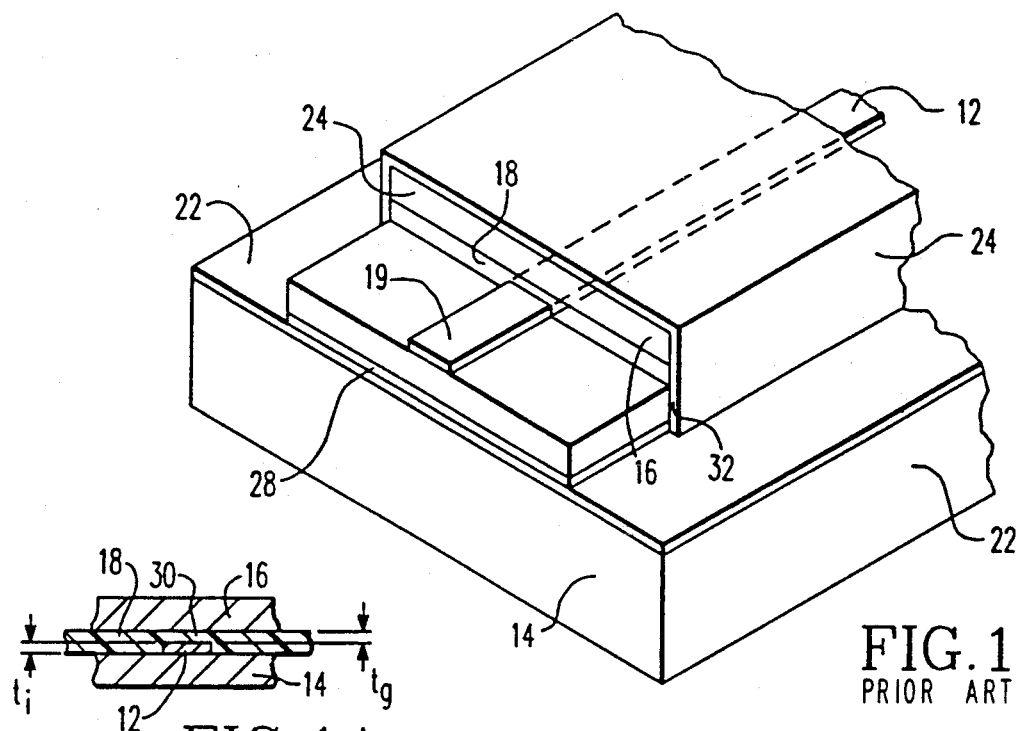
FIG. 1 PRIOR ART
FIG. 1A PRIOR ART
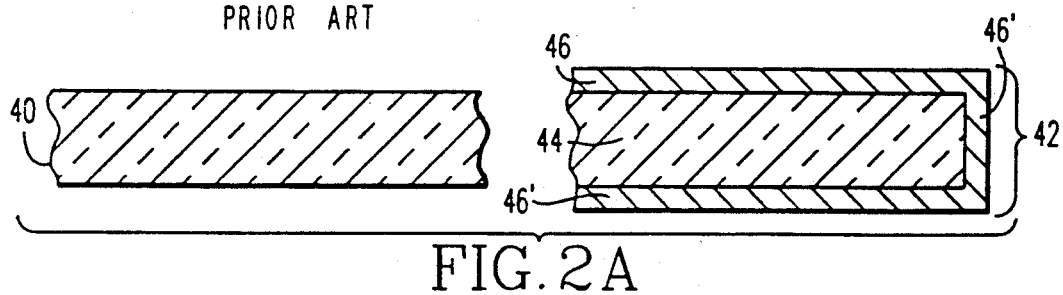
FIG. 2A
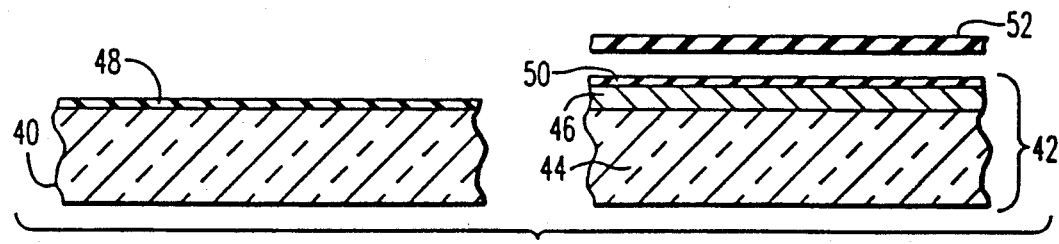
FIG. 2B
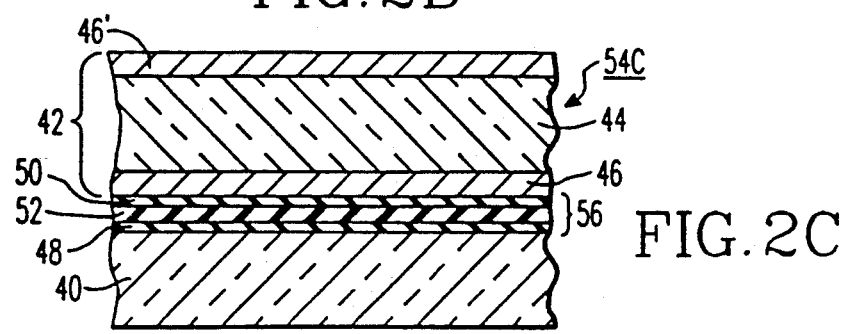
FIG. 2C

FREQUENCY SELECTIVE LIMITER WITH WELDED CONDUCTORS

BACKGROUND OF THE INVENTION

1. Field of the Invention

The invention relates to an attenuating element which utilizes a conductor located between bonded yttrium-iron-garnet (YIG) ferrites. More particularly the invention relates to an improved attenuating unit and method of fabrication with the conductor closely coupled to the ferrites.

2. Description of the Prior Art

Frequency selective limiters (FSL) are attenuating devices which utilize a yttrium-iron-garnet (YIG) material. FSLs attenuate higher power level signals while simultaneously allowing lower power level signals, separated by only a small frequency offset from the higher level signals, to pass with relatively low loss. YIG based FSLs are capable of limiting or attenuating across more than an octave bandwidth in the 2-8 GHz range.

A portion of a fully assembled FSL is illustrated in prospective in FIG. 1. Signal carrying conductor 12 is positioned between first and second planar YIG layers 14 and 16. The YIG layers 14 and 16 are bonded by nonconductive adhesive 18. The second YIG layer 16 usually has an overall length less than the overall length of the first layer 14. As a result, the end portion 19 (one shown) of the signal carrying conductor 12 extends outwardly beyond the transverse edge 20 of the YIG layer 16 and thereby forms a wire bonding site The lower YIG layer 14 has a metallized surface 22. The YIG layers 14 and 16 and the signal carrying conductor 12 are supported on a metallized surface 24 of substrate 26 by an intermediate layer of conductive epoxy 28. The device illustrated in FIG. 1 is described in greater detail in a U.S. Pat. No. 4,845,439 issued Jul. 4, 1989 entitled "Frequency Selective Limiting Device", in the name of Steven N. Stitzer et al. and assigned to Westinghouse Electric Corporation, the assignee herein.

The YIG layers 14 and 16 are bonded together in confronting relationship by the nonconductive adhesive 18. The conductor carried by YIG layer 14 is sandwiched between the YIG layers 14 and 16. The glue thickness $t_g$ results in a gap 30 shown in fragmentary detailed cross section of FIG. 1A. Even with good control, the glue thickness $t_g$ may be equal to the conductor 12 thickness, e.g. 0.10 mils. Thus, the gap 30 separating the conductor 12 from the upper YIG layer 16 may be sufficiently large such that coupling efficiency is significantly diminished.

A processing technique used for making an individual FSL unit 10 is described in the U.S. Pat. No. 4,970,775. In the technique described in Brown et al., a planar ferrite member is secured to a metallized surface of the substrate. Thereafter, a plurality of linear signal carrying conductors are placed on the ferrite member in spaced relation. A second ferrite member is then bonded to the conductors and the first ferrite member with a nonconductive adhesive to form a multilayer structure. Grooves are cut into the multilayer structure between the adjacent conductors and extend through both ferrite members exposing the metallized surface of the substrate. The upper surface and the grooves of the multilayer structure are metallized in a conformal manner to form a ground plane and the individual units are then separated into a plurality of individual FSL units.

It has been found that the nonconductive adhesive used bond ferrite members is difficult to apply. In particular, the thickness of the nonconductive adhesive 18 is difficult to control and may vary greatly.

The spacing between the ferrites has a strong influence on performance. From an electrical standpoint, the ideal glue thickness should be zero. However, it has been found that when the spacing between the YIG layers is increased from about 0.10 mils to about 1.0 mils, the limiting effect of the device decreases from about 14 db to about 6db which is unsatisfactory.

In pending U.S. patent application entitled "Coplanar Waveguide Frequency Selective Limiter", Ser. No. 07/414,877, filed Sep. 29, 1989 now U.S. Pat. No. 4,980,657 in the name of Stitzer et al., and assigned to Westinghouse Electric Corporation, an FSL with coplanar ground planes is described. The device has ferrites bonded with nonconductive adhesive.

In the arrangements described, secure deposition of the conformal ground plane is difficult to achieve reliably because the nonconductive adhesive sometimes interferes with the deposition of the metal in the seam 32 between the ferrites 14 and 16. If the ground plane 24 is not fully adhered, RF leakage and interference may occur. This is also an unsatisfactory result.

SUMMARY OF THE INVENTION

The present invention improves the performance of the described prior frequency selective limiters. In particular, the present invention improves coupling between the conductor to the ferrites and provides for improved RF shielding.

A frequency selective limiter is described in which first and second ferrite members have planar surfaces and at least one conductor located on the surface of each ferrite in intimate contact. The planar surfaces carrying the conductors are disposed in confronting relationship. Each conductor on the first ferrite is a mirror image and is paired to a corresponding conductor on the second ferrite. The paired conductors have confronting end surface portions which are intimately bonded or welded in electrical contact such that each of the paired conductors is electrically equivalent to a single conductor closely coupled to the ferrites. No other form of bonding is necessary to secure the ferrite members together.

In the invention, an external conformal ground plane is more securely deposited in the regions where the ferrites abut. In a particular embodiment, coplanar ground planes located between the ferrites are securely bonded to the conformal ground plane.

BRIEF DESCRIPTION OF THE DRAWINGS

FIG. 1 is a perspective view of an FSL described in the above referenced U.S. Pat. No. 4,845,439 of Stitzer et al.;

FIG. 1A is a fragmentary cross-sectional detail of a portion of the FSL shown in FIG. 1;

FIGS. 2A-2K present a series of fragmentary side sectional views which represent an exemplary sequence of steps for assembling a frequency selective limiter according to the present invention;

DESCRIPTION OF THE PREFERRED EMBODIMENT

Figure 2D:
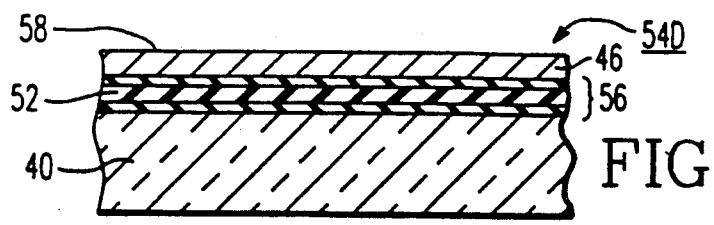

The present invention comprises an improved YIG based FSL and a method of manufacture. FIGS. 2A-2K illustrate in a series of fragmentary side section views exemplary fabrication and processing steps for the manufacture of an FSL according to the present invention. It should be understood, that if desired, more than one FSL may be fabricated at a time as described in the above noted Brewer et al. application.

The starting materials for the process (FIG. 2A) are a nonmagnetic substrate 40 and a wafer 42 formed of a nonmagnetic substrate 44 having a layer of ferrite material 46 formed thereon. In the preferred embodiment, the nonmagnetic substrates 40 and 44 are gadolinium-gallium-garnet (GGG) wafers that are available commercially. The ferrite material 46 on the wafer is an epitaxially grown yttrium-iron-garnet (YIG) dielectric film typically formed about and around the ferrite on all sides as shown. The ferrite material 46' on the sides and lower side is extraneous. The GGG wafer 44 provides support for the YIG film 46.

Metallized surfaces 48 and 50 are formed on the respective wafers 40 and 42 as illustrated in FIG. 2B. The two substrates 40 and 42 are then bonded together by a conductive metal preform, e.g. a gold/tin alloy wafer 40 located in confronting relationship between the metallized surfaces 48 and 50 as shown in FIG. 2C to form multilayer structure 54C. The preform 52 and the metallized surfaces 48 and 50 are bonded together by heating in a hydrogen furnace at an elevated temperature above the fastening temperature required to assemble the top and bottom halves. Although shown as a multilayer structure for clarity, the metallized surfaces 48 and 50 and preform 52 fuse together to form a unitary or integral lower ground plane 56 for the structure. In a preferred embodiment, it is practical to have graded melting points for the metallized surfaces 48 and 50 and the preform 52 which melts at a lower temperature.

Portions of the substrate 44 and the extraneous YIG material 46' are removed by grinding and polishing resulting in multilayer structure 54D (FIG. 2D). The thickness and surface finish of the remaining YIG layer 46 are establish by known lapping and polishing techniques. Preferably the YIG layer is approximately 4 mils thick.

Figure 2E:
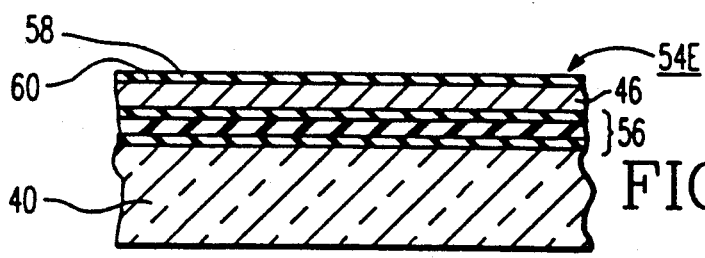

In FIG. 2E the upper surface 58 of the YIG layer 46 is metallized by a sputtered chromium/gold layer 60 forming multilayer structure 54E. The metallized layer 60 is preferably formed to a thickness of about 4 microns.

Figure 2F:
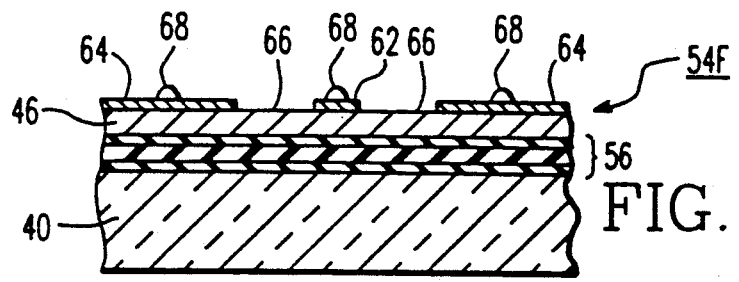

In FIG. 2F a metallic signal conductor 62 and coplanar ground planes 64 are formed by removal of selected portions of the film 58 resulting in nonconductive gaps 66 between the conductor 62 and the adjacent coplanar ground planes 64. Thereafter, metallized bumps 68 are formed on the conductor 62 and the ground plane 64 as illustrated. The result is a multilayer structure 54F. Known photolithographic techniques common to the microelectronic industry may be use to form the conductors 62, the ground planes 68 and the metal bumps 68.

Figure 2G:
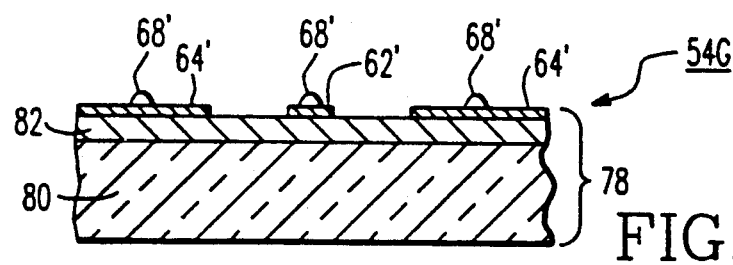

A separately formed multilayer structure 54G shown in FIG. 2G includes a wafer 78 comprising GGG substrate 80 and a YIG layer 82. A conductor 62' and a pair of adjacent ground planes 64' which have metallized bumps 68' thereon are formed on the wafer 78 by photolithographic techniques. The size, spacing and location of the conductor 62', ground plane 64' and the metallized bumps 68' correspond to the size, spacing and location of the conductor 62, the ground planes 64 and the bumps 68 illustrated in the multilayer structure 54F described above. The conductors 62, 62', ground planes 64, 64' and bumps 68, 68' are formed in mirror images on the respective substrates.

Figure 2H:
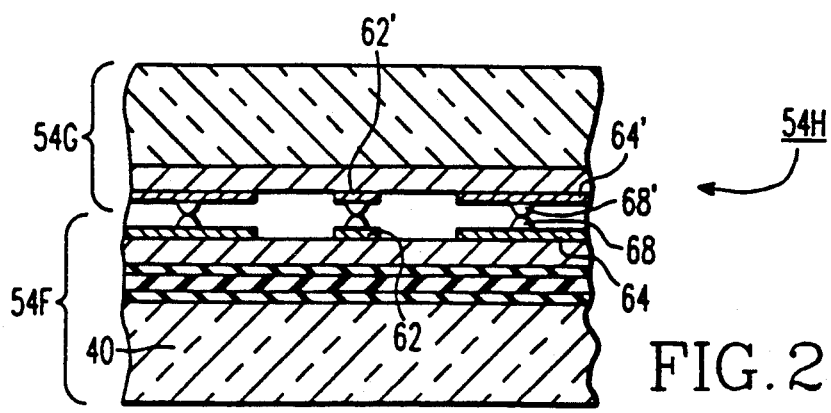
Figure 2I:
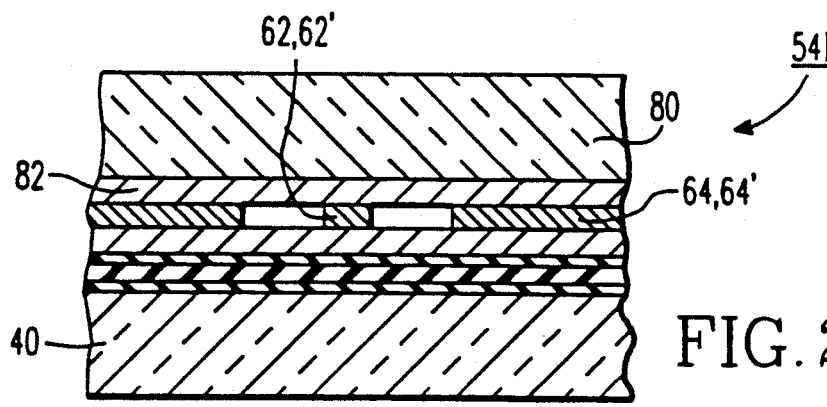

In FIG. 2H the multilayer structures 54F and 54G are combined in confronting relationship to form a multilayer structure 54H. In the arrangement, the conductors 62 and 62' and the ground planes 64 and 64' are aligned and the bumps 68, 68' are in contact as shown. Thereafter, the composite multilayer structure 4H is located in a hydrogen atmosphere furnace (not shown) and heated such that the metal bumps 68, 68' melt or reflow causing the conductors 62-62' and the ground planes 64-64' to fuse resulting in the multilayer structure 54I shown in FIG. 2I. In the embodiment described, the melting temperature of the bumps 68, 68' is lower than the melting point of the preform 52 (FIG. 2C) so that the structure stays together during fabrication.

Figure 2J:
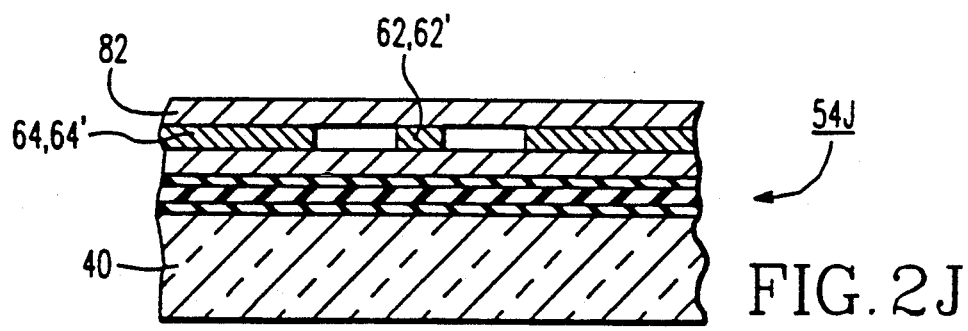

Referring to FIG. 2J, the GGG material 80 and a portion of the YIG layer 82 is removed by grinding and polishing resulting in a finished YIG layer 82 of about 4 mils thick. Multilayer structure 54J may include one or more devices on the support 40.

Figure 2K:
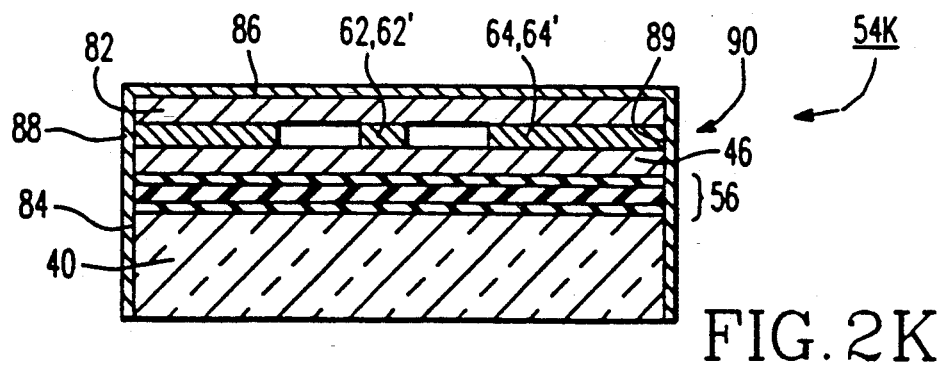

Multilayer structure 54K in FIG. 2K is formed by cleaving the structure 54J along side edges 84. Thereafter a conformal outer coating is sputtered on the outer surfaces 86 forming a ground plane 88. The ground plane 88 firmly adheres to the outer marginal edges 89 of the coplanar ground planes 64-64'. In accordance with the invention, the ground plane 88 thereby seals the side seam 90 between the ferrites 46 and 82. The ground plane 88 also contacts the lower ground plane 56 first formed by bonding the metallized substrates 40 and 42 as illustrated in FIG. 2C.

Figure 3:
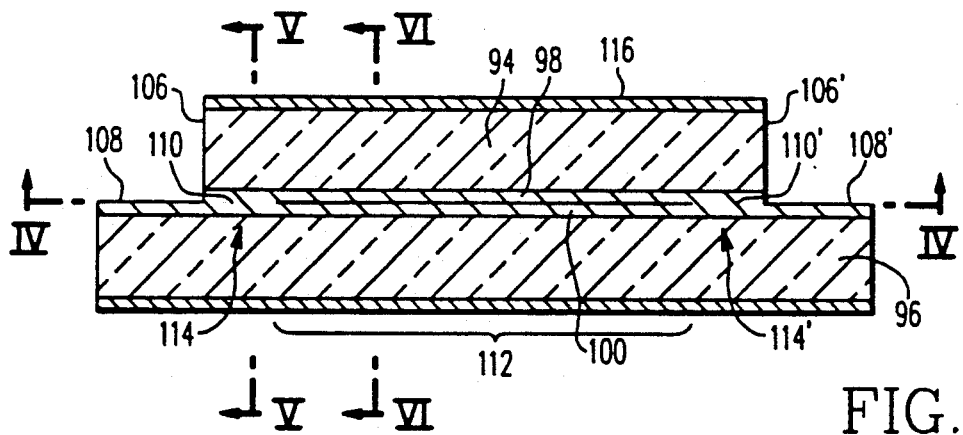
FIG. 3 illustrates a side view of an FSL according to the present invention.
Figure 6:
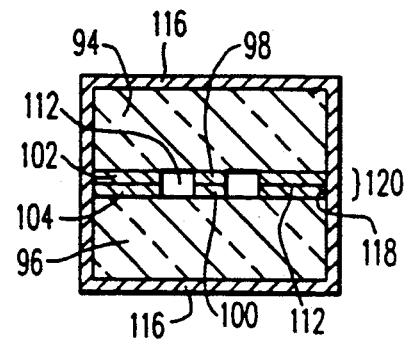
FIG. 6 is a cross-sectional view of the FSL according to the present invention taken along lines VI—VI of FIG. 3.

FIG. 3 is a side sectional view of a frequency selective limiter 92 according to the invention which has been simplified for clarity. The FSL 92 includes upper and lower YIG layers 94 and 96 which are located in confronting relationship as shown. Each YIG layer 94 and 96 carries respective signal carrying conductors 98, 100 and coplanar ground planes 102 and 104 (FIG. 6). The lower YIG layer 96 is longer than the upper YIG layer 94 and the lower conductive member 100 extends beyond the terminal ends 106-106' of the upper YIG layer thereby providing wire bonding pads 108-108' as illustrated. Portions of the conductors 98, 100 and ground planes 102, 104 are fused together in weld areas 110-110' near their corresponding opposite ends 114-114'. Intermediate portions 112 of the conductors 98, 100 and ground planes 102, 104 may be in electrical contact but are not necessarily fused together.

Figure 5:
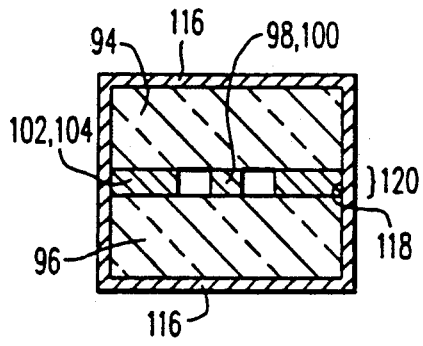
FIG. 5 is a cross-sectional illustration of the FSL according to the present invention taken along lines V—V of FIG. 3.
Figure 4:
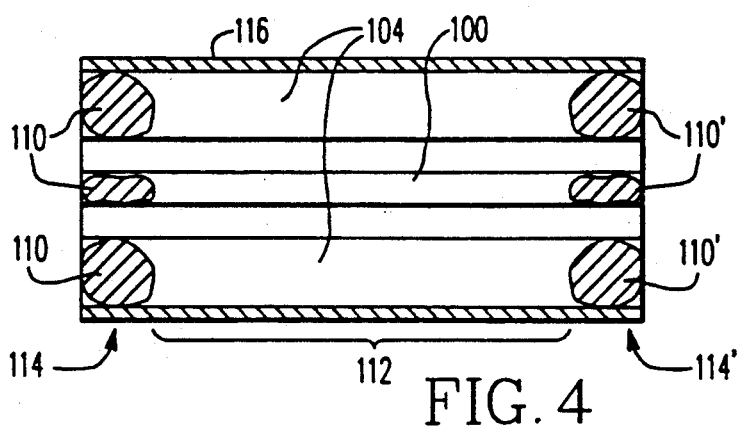
FIG. 4 is a side sectional view of an FSL according to the present invention taken along lines IV—IV of FIG. 3.

In the sectional view of FIG. 4 the weld areas 110 -110' are illustrated. As previously noted, when the structure is placed in the heating furnace the bumps (not shown) melt and reflow causing the conductors 98, 100 and ground planes 102, 104 to be fused together. The arrangement illustrated in FIGS. 3 and 4 is the resulting structure. FIGS. 5 and 6 are cross-sectional diagrams taken along lines V—V and VI—VI of FIG. 3 respectively. In FIG. 5 the conductors 98, 100 and ground planes 102, 104 are fused together. In FIG. 6 the conductors 98, 100 and ground planes 102, 104 are in electrical contact but are not necessarily fused together in the intermediate area 112.

Figure 7:
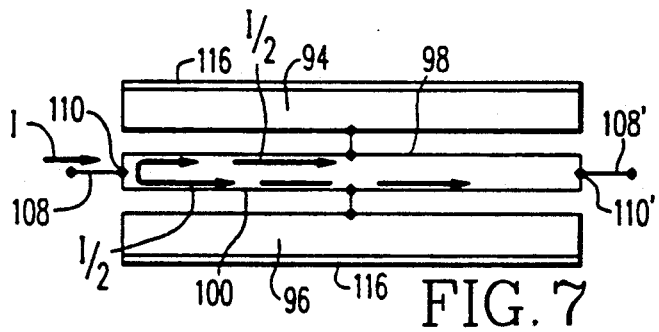
FIG. 7 is an equivalent circuit of an FSL according to the present invention.

FIG. 7 illustrates the equivalent electrical circuit of the signal carrying conductors 98, 100 of the device illustrated in FIG. 3. In the arrangement, the YIG layers 94, 96 carry the respective conductors 98, 100. A current or signal input on the bonding pad 108 is split at the fused junction 110 of the conductors 98, 100. Approximately half the current flows in each conductors 98, 100. The signal is combined at the remote fused junction 110' and is delivered to the bonding pad 108'. In accordance with the invention, a current I/2 flowing in each of the conductors 98, 100 interacts with the respective YIG films 94, 96 to effect limiting. In the arrangement illustrated the conductors 98, 100 are in intimate contact with the respective YIG layers 94, 96 so that there is no loss of coupling efficiency between the conductors and the YIG.

In the arrangement illustrated in FIG. 1, the conductor 12 is in intimate contact with the lower YIG film 14. However, because of the construction employing the nonconducting adhesive 18, the gap 30 formed between the conductor 12 and the upper YIG film 16 reduces the coupling efficiency of the signal with the YIG film. Accordingly, limiting efficiency may be reduced by 7db. In the present invention because the conductors 98, 100 are in intimate contact with the corresponding YIG layers 94, 96, the total current I, although split between the conductors 98, 100 is coupled efficiently with the YIG. It is desirable but not essential that the conductors 98, 100 be in electrical contact in the intermediate area 112.

Outer ground plane 116 is formed about the YIG films 94, 96 by sputtering. In particular, the ground plane 116 contacts outer marginal edges 118 of the coplanar ground planes 102, 104 and bridges the seam 120 between the upper and lower films 94, 96. RF leakage is thereby reduced or eliminated.

Figure 8:
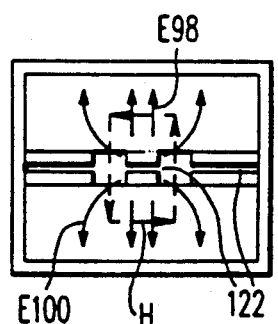
FIG. 8 illustrates a magnetic circuit for the arrangement of FIG. 3.

FIG. 8 illustrates the exemplary magnetic circuit of the invention with certain features are exaggerated for clarity. Signal carried by the conductors 98, 100 splits between the two and each establishes corresponding electric field E98 and E100 in the YIG films 94, 96 as illustrated. Magnetic field H is coupled through the YIG films 94, 96 and across the exaggerated air gap 122 between the films. Each of the conductors 98, 100 is in intimate contact with the YIG films 94, 96. Accordingly, essentially no significant air gap exists between the conductors 98, 100 and the corresponding YIG films 94, 96. Thus, the electric fields E98, E100 and magnetic field H are closely coupled with little or no loss. Any loses occurring across the air gap 122 are negligible compared to losses which might occur between a conductor and the YIG film.

The present invention thus represents an improved and simplified FSL arrangement. In particular, the present invention provides for more accurate and close coupling of the conductors with the YIG films and reduced RF leakage.

While there has been described what at present are believed to be the preferred embodiments of the present invention, it will be apparent to those skilled in the art the various changes and modifications may be made therein without departing from the invention, and is intended in the appended claims to cover all such modifications and changes that come within true spirit and scope of the invention.

What is claimed is:

1. A frequency selective limiter comprising:
   first and second ferrites each having a surface in closely spaced confronting relationship; and
   at least one conductor for each ferrite disposed in intimate closely coupled contact with the ferrite on the corresponding surface thereof, each conductor on the first ferrite being paired with a corresponding conductor on the second ferrite, said paired conductors having confronting end surface portions being intimately bonded to each other in parallel electrical contact such that said paired conductors are electrically equivalent to a single conductor closely coupled with each of the ferrites.

2. The frequency selective limiter of claim 1 wherein the surfaces of the ferrites are planar and the conductor comprises:
   a signal carrying conductor and a pair of laterally spaced conductive coplanar ground planes on each ferrite, said coplanar ground planes each having a marginal edge extending from a corresponding edge portion of the ferrite and having a marginal edge spaced from the signal carrying conductor remote from the marginal edge of the ferrite.

3. The frequency selective limiter of claim 2 further comprising a ground plane surrounding the ferrites and being in contact with the coplanar ground planes on each ferrite, said surrounding ground plane for closing the marginal edges of the ground plane and the ferrites.

4. The frequency selective limiter of claim 1 wherein the paired conductors are mirror images of each other over selected length thereof.

5. The frequency selective limiter of claim 1 wherein the first ferrite is longer than the second ferrite and the corresponding conductor deposited on the first ferrite has exposed contact points beyond ends of the second ferrite.

6. The frequency selective limiter of claim 1 wherein the ferrites are planar members.

7. The frequency selective limiter of claim 6 wherein the ferrites have spaced marginal edges further comprising a ground plane surrounding the first and second ferrites for closing marginal edges of the ferrites.

8. The frequency selective limiter of claim 7 wherein a support is bonded to one side of one of the ferrites in spaced relationship from the signal carrying conductor.

9. The frequency selective limiter of claim 8 wherein the support comprises a GGG wafer having a metallized planar surface, the ferrite is a YIG film having a metallized surface in confronting relationship with the GGG, and a metal preform located between the metallized surfaces bonds the ferrite to the support.

10. The frequency selective limiter of claim 9 wherein the preform is a gold/tin alloy having a melting point lower than the metallized surfaces.

11. The frequency selective limiter of claim 9 wherein the metallized surfaces and the preform form part of the ground plane.

12. The frequency selective limiter of claim 11 wherein the conductors have a melting point higher than the preform.

13. The frequency selective limiter of claim 1, wherein each conductor for the respective first and second ferrite is in direct physical bonded contact therewith being substantially free of intermediate materials.

14. A frequency selective limiter comprising:
first and second ferrites each having a generally planar surface; and
first and second conductors disposed by sputtering on said planar surfaces of said first and second ferrites respectively;
wherein said first and second ferrites are joined in confronting relationship so that said first and second conductors form a pair of confronting conductors;
wherein said pair of confronting conductors is fused such that said pair of confronting conductors is electrically equivalent to a single conductor.

15. A frequency selective limiter comprising:
first and second ferrites each having a generally planar surface; and
first and second conductors formed by photolithographic techniques on said planar surfaces of said first and second ferrites respectively;
wherein said first and second ferrites are joined in confronting relationship so that said first and second conductors form a pair of confronting conductors;
wherein said pair of confronting conductors is fused such that said pair of confronting conductors is electrically equivalent to a single conductor.

* * * * *